United States Patent
Hotta

(10) Patent No.: US 6,376,884 B1
(45) Date of Patent: Apr. 23, 2002

(54) SEMICONDUCTOR APPARATUS, WHICH IS CONSTITUTED IN MINIMUM CELL ARRAY AREA, WHILE CELL ARRAY PROPERTY IS MAINTAINED IN WHICH DUMMY CELL IS USED

(75) Inventor: Mitsuhiro Hotta, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/639,348

(22) Filed: Aug. 16, 2000

(30) Foreign Application Priority Data

Aug. 30, 1999 (JP) ............................................. 11-242787

(51) Int. Cl.[7] ......................... H01L 29/76; H01L 29/94; H01L 31/062; H01L 31/113; H01L 31/119
(52) U.S. Cl. ....................................... 257/379; 257/393
(58) Field of Search ................................ 438/130, 241, 438/258, 275, 279, 303, 595, 642, 305; 257/300, 369, 379, 393, 401, 355–358, 390, 326

(56) References Cited

U.S. PATENT DOCUMENTS

| | | | | |
|---|---|---|---|---|
| 5,641,699 A | * | 6/1997 | Hirase et al. | 438/130 |
| 6,020,616 A | * | 2/2000 | Bothra et al. | 257/381 |
| 6,153,476 A | * | 11/2000 | Inaba et al. | 438/275 |

FOREIGN PATENT DOCUMENTS

| | | | |
|---|---|---|---|
| JP | 362281444 A | * | 12/1987 |
| JP | 5-226615 | | 9/1993 |
| JP | 10-84087 | | 3/1998 |

\* cited by examiner

*Primary Examiner*—Olik Chaudhuri
*Assistant Examiner*—Hoai Pham
(74) *Attorney, Agent, or Firm*—Sughrue Mion, PLLC

(57) ABSTRACT

A semiconductor apparatus includes a cell and a dummy cell. The cell has a first conductivity type of diffusion layer formed in a second conductivity type of semiconductor region. The second conductivity type is opposite to the first conductivity type. The dummy cell has the second conductivity type of dummy diffusion layer formed in the semiconductor region. The dummy cell is adjacent to the cell.

21 Claims, 8 Drawing Sheets

SEMICONDUCTOR APPARATUS, WHICH IS CONSTITUTED IN MINIMUM CELL ARRAY AREA, WHILE CELL ARRAY PROPERTY IS MAINTAINED IN WHICH DUMMY CELL IS USED

BACKGROUND OF THE INVENTION

1. Field of the Invention

The present invention relates to a semiconductor apparatus. More particularly, the present invention relates to a CMOS type SRAM having a dummy cell outside a cell array.

2. Description of the Related Art

The typical configurations of a memory cell array and its periphery in a typical semiconductor memory will be described below. The semiconductor memory is usually provided with a plurality of memory cell arrays and a plurality of peripheral circuits. In the memory cell array, memory cells for storing information are arrayed continuously in lines and rows. The peripheral circuit is composed of a sense amplifier, an address decoder, a circuit for driving them, and the like.

The memory cell array occupies most of a chip area in the semiconductor memory. Thus, in order to reduce the chip area, the memory cell is highly integrated under a minutely dimensional accuracy close to a minimum machining dimension in a manufacturing process. The optical continuation of a mask pattern used to form the memory cell array is lost in a boundary between the memory cell array and the peripheral circuit.

For this reason, when the mask pattern is viewed from the inside of the memory cell array, it is shifted from a dense mask pattern to a rough mask pattern, in the boundary. Thus, an exposure strength received by a resist is different depending on a difference between the roughness and the density. This leads to a difference between patterns formed from the resist pattern. For example, gate electrodes, source and drain diffusion layers, and connection hole diameters of MOS transistors are respectively manufactured in different dimensions between the inside of the memory cell array and the end of the memory cell array adjacent to the boundary of the peripheral circuit.

The reason of the variation in the exposure and diffusion condition is described in further detail. The respective patterns of the memory cell at the end in the memory cell array are complex and minute. However, there is no minute pattern in the peripheral circuit adjacent to the end of the memory cell array, as compared with the memory cell. Thus, in the peripheral circuit adjacent to the end of the memory cell array, regularities, such as detour, reflection and the like, with regard to light in the resist exposure are different from those within the memory cell array. Because of this difference, a resist film can not be exposed accurately in accordance with the pattern. Hence, in an extreme case, a defect caused by a pattern break is induced in the memory cell at the end of the memory cell array. This results in a drop of a yield of a chip.

Typically, one or more dummy cells, each of which has the same shape as the memory cell and does not carry out a storing operation, are placed at the end of the memory cell array, in order to avoid the above-mentioned problems. Thus, the suppression of the pattern break in the memory cell for carrying out the storing operation can protect the drop of the yield.

With regard to the semiconductor apparatus targeted for the present invention in which the memory cell array is composed of a CMOS type memory cell, their problems will be described below.

A p-type transistor is formed in a region of an n-well to which a positive power supply potential is sent. An n-type transistor is formed in a region of a p-well to which a ground potential is sent. A diffusion layer for sending a potential to a well in a memory cell is positioned in a boundary of a peripheral circuit outside the dummy cell at the end of the memory cell array. The positive power supply potential is sent through an n-type diffusion layer to the n-well, and the ground potential is sent through a p-type diffusion layer to the p-well.

FIG. 1 shows a plan view of a diffusion layer structure at the above-mentioned conventional end of the memory cell array. 60 denotes a memory cell array. CMOS transistors 48 are regularly arrayed in the memory cell array 60. 61 denotes a peripheral circuit, and 62 denotes a dummy cell region. 53 denotes a diffusion layer region for sending potentials to wells respectively. An n-type diffusion layer 44 is formed in an n-well 42 as the diffusion layer for sending the potential to the well. A p-type diffusion layer 46 is formed in a p-well 51 as the diffusion layer for sending the potential to the well.

A p-type diffusion layer 43 is formed in the dummy cell region 62 and the memory cell array 60 in the n-well region 42. An n-type diffusion layer 45 is formed in the dummy cell region 62 and the memory cell array 60 in the p-well region 51.

FIG. 2 shows a sectional view of a portion denoted by a straight line Z–Z' crossing the dummy cell region 62 and the memory cell array 60 in the n-well region 42 in FIG. 1. 41 denotes a p-type semiconductor substrate, and it is usually fixed to the ground potential.

In the semiconductor memory, the memory cell array is usually divided because of the limitation of a pre-charge current in a digit line for inputting and outputting a data stored in a memory cell and the delay of a word signal line for selecting memory cells. The peripheral circuits, such as a decoder for controlling the word signal line and the like, are mounted between the divided memory cell arrays.

In the conventional semiconductor memory circuit, a diffusion layer for sending a potential to a well and a dummy cell are mounted in a boundary between a memory cell array and a peripheral circuit. Thus, an area necessary for the boundary between the memory cell array and the peripheral circuit is increased proportionally to the division of the memory cell array. This results in the increase of the area of the semiconductor memory circuit.

Japanese Laid Open Patent Application (JP-A-Heisei, 5-226615) discloses the following semiconductor memory. Accumulation nodes constituting a dummy cell array are integrally connected to each other. Then, a drive potential Vcc is sent to them. Also, a diffusion layer for forming a drain of a selection transistor is connected by using a conductive layer for forming a bit line. Then, the drive potential Vcc is sent to it. Thus, the potential Vcc is sent to an N-type diffusion layer constituting a source and a drain of the selection transistor.

Japanese Laid Open Patent Application (JP-A-Heisei, 10-84087) discloses the following semiconductor memory circuit. Typically, sense amplifiers and memory cells are alternately mounted in a center of a memory array. At both ends of the memory array, an N-well region is positioned on a side of a boundary between the memory array and a periphery, and an end sense amplifier at which a p-well region is located is mounted within it. Then, a Deep N-well region is formed in a lower layer of the N-well region and the P-well region in the memory array. Its end extends up to a middle of the lower layer of the P-well region in the periphery. Also, a sub contact region, a well contact region and a sub contact region are arranged in order starting from outside a chip.

SUMMARY OF THE INVENTION

The present invention is accomplished in view of the above mentioned problems. Therefore, an object of the present invention is to provide a semiconductor apparatus, which is constituted in a minimum cell array area, while a cell array property is maintained in which a dummy cell is used.

In order to achieve an aspect of the present invention, a semiconductor apparatus, includes: a cell having a first conductivity type of diffusion layer formed in a second conductivity type of semiconductor region, wherein the second conductivity type is opposite to the first conductivity type; and a dummy cell having the second conductivity type of dummy diffusion layer formed in the semiconductor region, wherein the dummy cell is adjacent to the cell.

In order to achieve another aspect of the present invention, a semiconductor memory apparatus, includes: a memory cell having a first conductivity type of memory diffusion layer formed in a second conductivity type of semiconductor region, wherein the second conductivity type is opposite to the first conductivity type; and a dummy cell having the second conductivity type of dummy diffusion layer formed in the semiconductor region, wherein the dummy cell is adjacent to the memory cell.

In this case, a predetermined voltage is supplied to the semiconductor region through the dummy diffusion layer.

Also in this case, the predetermined voltage is used to drive the cell.

Further in this case, the predetermined voltage is a positive voltage when the dummy diffusion layer is n-type and the predetermined voltage is a grounded voltage when the dummy diffusion layer is p-type.

In this case, the dummy cell is formed to be a same shape as the cell.

Also in this case, the dummy diffusion layer is formed to be a same shape as the diffusion layer.

Further in this case, the dummy cell is formed in an end portion of the semiconductor region.

In order to achieve still another aspect of the present invention, the semiconductor apparatus, further includes: a cell array in which a plurality of the cells are arranged at substantially equal intervals with each other, and wherein the dummy cell and the plurality of cells are arranged at the substantially equal intervals with each other.

In this case, the semiconductor apparatus, further includes: a specific dummy cell having a specific dummy diffusion layer which is formed inside the cell array, and wherein a preset voltage is supplied to the semiconductor region through the specific dummy diffusion layer and the specific dummy diffusion layer is formed to be a same shape as the diffusion layer.

Also in this case, the specific dummy cell and the plurality of cells are arranged at the substantially equal intervals with each other.

Further in this case, a predetermined voltage is supplied to the semiconductor region through the dummy diffusion layer and the predetermined voltage is substantially identical to the preset voltage.

Further in this case, the semiconductor apparatus further includes: a peripheral circuit unit provided to be adjacent to the dummy cell.

In order to achieve yet still another aspect of the present invention, a semiconductor apparatus, includes: a first transistor having a first conductivity type of first diffusion layer formed in a second conductivity type of second semiconductor region, wherein the second conductivity type is opposite to the first conductivity type; a second transistor having the second conductivity type of second diffusion layer formed in the first conductivity type of first semiconductor region, wherein the first and second diffusion layers are arranged at substantially equal intervals with each other to form a cell array; a first dummy cell having the second conductivity type of first dummy diffusion layer formed in the second semiconductor region, wherein the first dummy diffusion layer is adjacent to the first diffusion layer; and a second dummy cell having the first conductivity type of second dummy diffusion layer formed in the first semiconductor region, wherein the second dummy diffusion layer is adjacent to the second diffusion layer, and wherein the first and second dummy cells are arranged outside the cell array and the first and second diffusion layers and the first and second dummy diffusion layers are arranged at the substantially equal intervals with each other.

In this case, a first predetermined voltage is supplied to the first semiconductor region through the second dummy diffusion layer and the second predetermined voltage is supplied to the second semiconductor region through the first dummy diffusion layer.

Also in this case, the first predetermined voltage is used to drive the second transistor and the second predetermined voltage is used to drive the first transistor.

Further in this case, the first dummy diffusion layer is formed to be a same shape as the first diffusion layer and second dummy diffusion layer is formed to be a same shape as the second diffusion layer.

In this case, the semiconductor apparatus, further includes: a first specific dummy diffusion layer formed inside the cell array, wherein the first predetermined voltage is supplied to the first semiconductor region through the first specific dummy diffusion layer and the first specific dummy diffusion layer is formed to be a same shape as the second diffusion layer; and a second specific dummy diffusion layer formed inside the cell array, wherein the second predetermined voltage is supplied to the second semiconductor region through the second specific dummy diffusion layer and the second specific dummy diffusion layer is formed to be a same shape as the first diffusion layer.

In this case, the first and second specific dummy diffusion layers and the first and second diffusion layers and the first and second dummy diffusion layers are arranged at the substantially equal intervals with each other.

Also in this case, the semiconductor apparatus, further includes: a peripheral circuit unit provided to be adjacent to the first and second dummy cells.

Further in this case, the first and second transistors are a complementary pair.

In this case, the semiconductor apparatus is a SRAM (static random access memory).

Also in this case, the first and second dummy cells are formed in end portions of the first and second semiconductor regions, respectively.

DESCRIPTION OF THE PREFERRED EMBODIMENTS

An embodiment of a semiconductor memory apparatus in the present invention will be described below in detail with reference to the attached drawings.

A first embodiment of the present invention will be described below in detail with reference to FIGS. 4 to 6.

Figure 4:
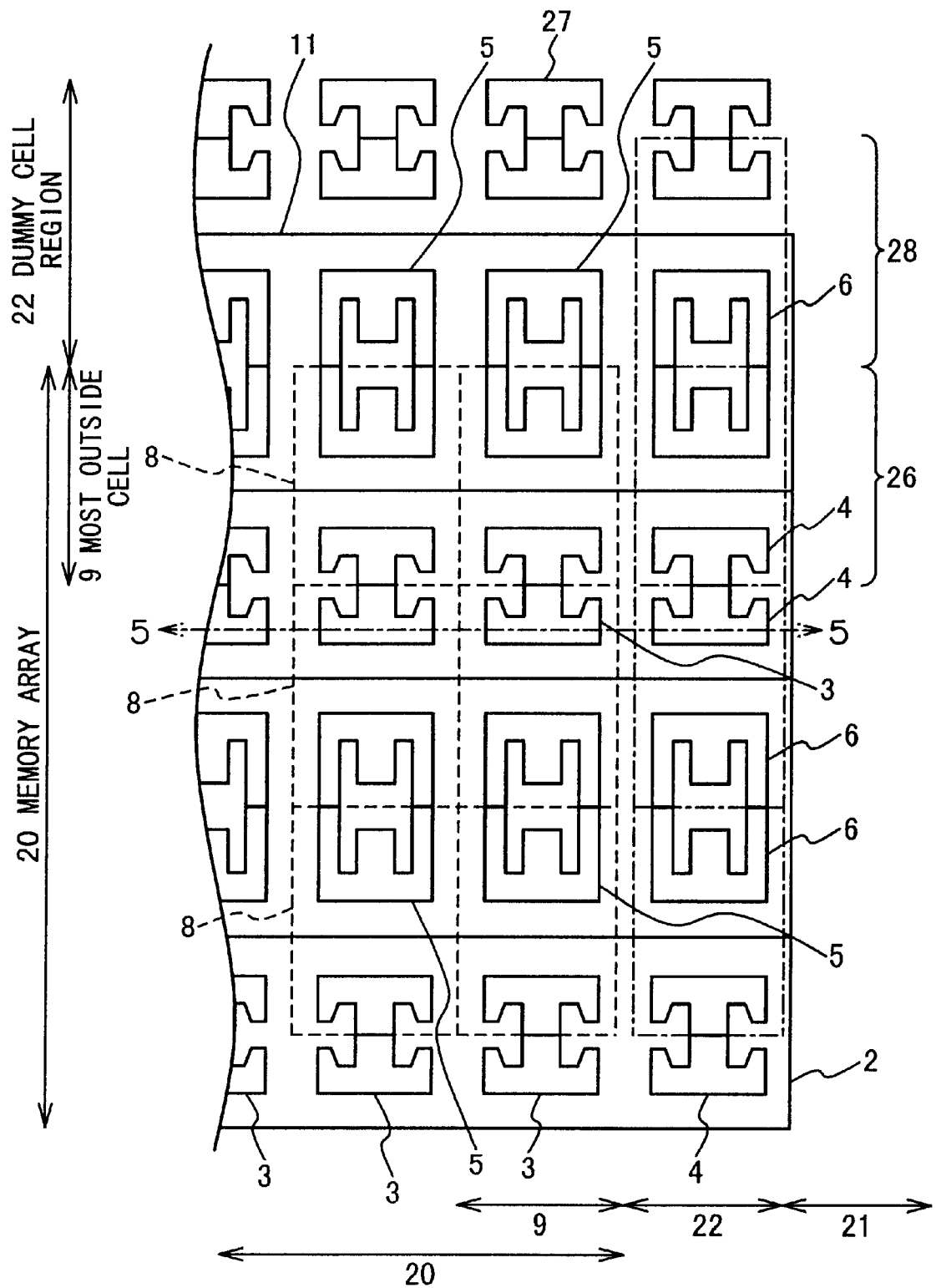
FIG. 4 is an enlarged plan view showing a first embodiment of a semiconductor apparatus in the present invention.

FIG. 4 is a plan view showing a plane relation between an inner cell and a dummy cell in a cell array periphery indicating the feature of this embodiment.

Figure 5:
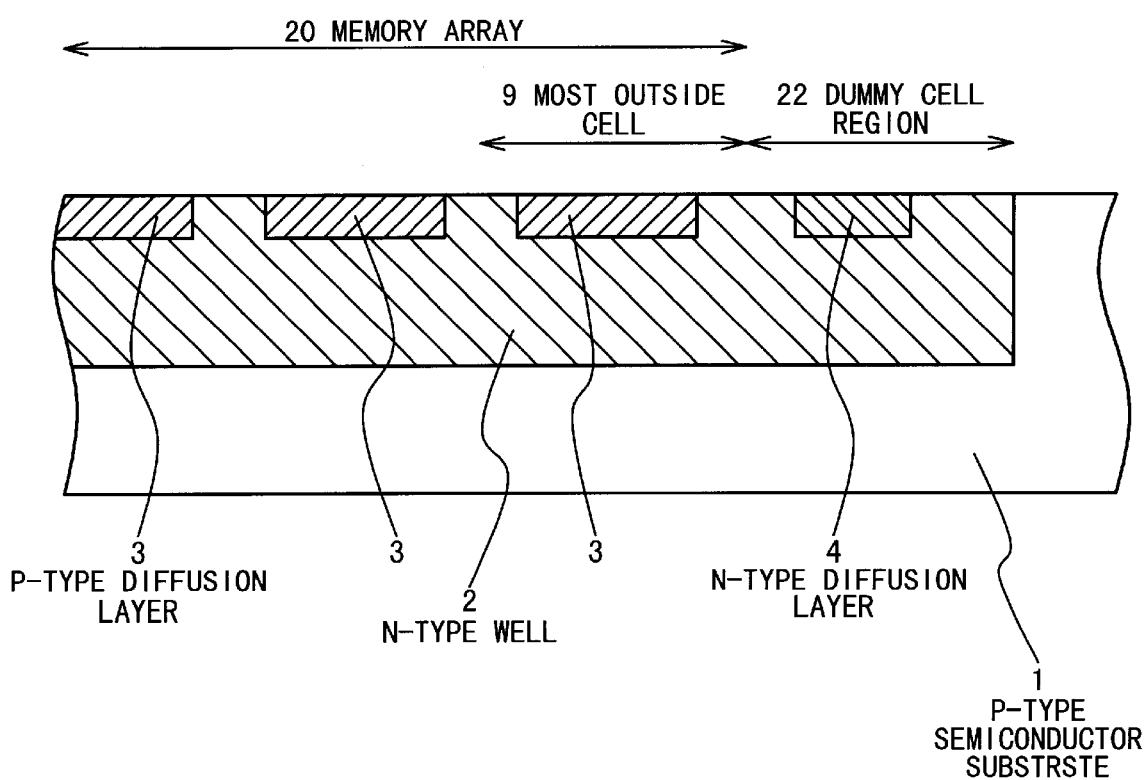
FIG. 5 is a sectional view in a cut line X–X' of FIG. 4.

FIG. 5 is a sectional view along a cut line X–X' cutting the inner cell and the dummy cell in FIG. 4 in a length direction of a well to show a diffusion layer formed in the well.

Figure 6A:
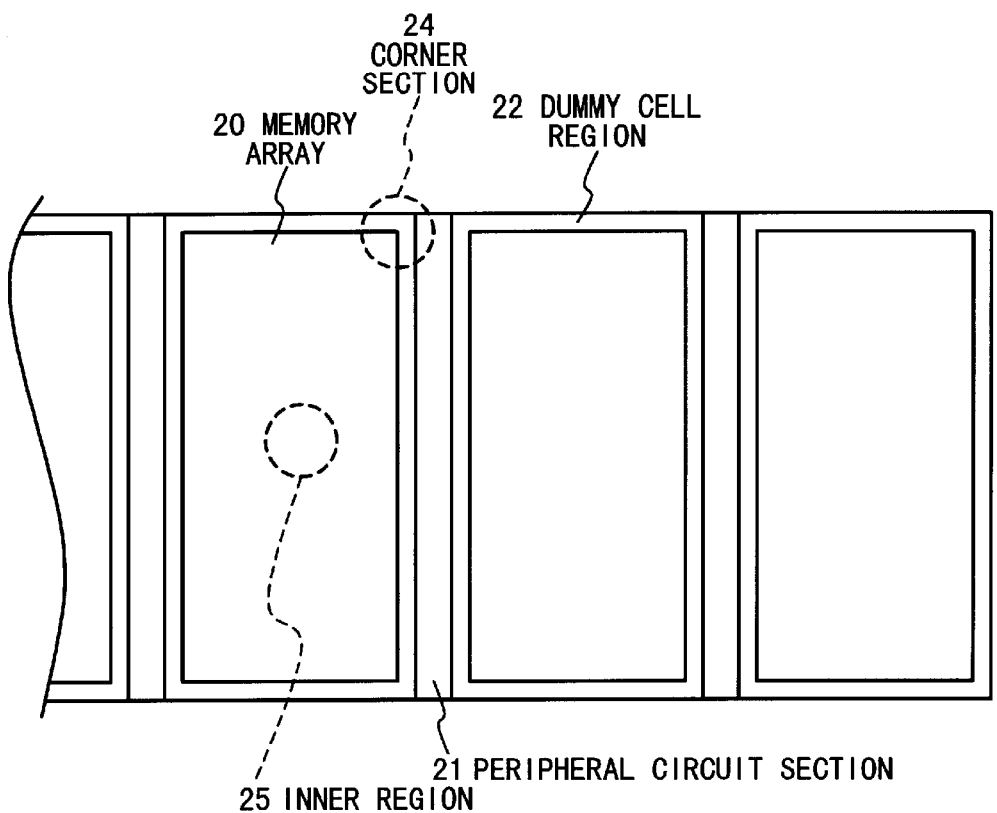
FIG. 6A is a plan view showing a configuration of a typical memory cell array.

FIG. 6A is a plan view schematically showing a configuration of a typical semiconductor memory and a memory cell array in this embodiment.

Figure 6B:
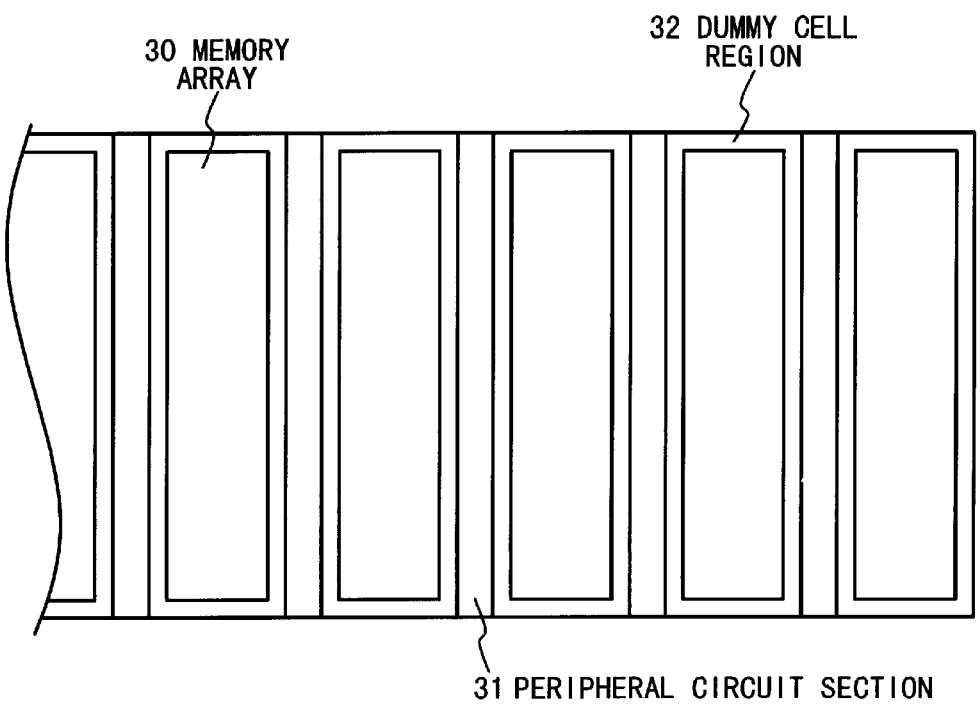
FIG. 6B is a plan view showing a configuration of another typical memory cell array.

And, FIG. 6B is a plan view schematically showing another configuration of a typical semiconductor memory and a memory cell array in this embodiment.

As shown in a plan view of FIG. 6A, individual memory cells in the semiconductor memory constitute a memory cell array 20. A portion between the memory cell arrays 20 adjacent to each other is divided by a peripheral circuit section 21.

The peripheral circuit section 21 functions as a word signal line selection decoder. The dummy cell is positioned in a dummy cell region 22 that is an end of the memory cell array 20.

The number of divisions in the memory cell array 20 is different depending on the limitation of a pre-charge current of the digit line, and the delay of the work signal line. As shown in FIG. 6B, as the number of divisions in the memory cell array is increased, the numbers of memory cell arrays 30 and peripheral circuits 31 are increased to thereby require a larger number of dummy cell regions 32.

FIG. 4 is an enlarged plan view showing the conditions of the dummy cell region 22 and the memory cell array 20 adjacent thereto in FIG. 6A (or, FIG. 6B). That is to say, in the FIG. 4, a corner region 24 of the memory cell array 20 is enlarged.

As shown in FIG. 4, CMOS transistors 8 constituting the memory cell array 20 are regularly arranged within each of an n-well 2 and a p-well 11. A plurality of n-type diffusion layers 4 constituting the dummy cell region 22 are formed in an end of the n-well 2. A plurality of p-type diffusion layers 6 constituting the dummy cell region 22 are formed in an end of the p-well 11.

A dummy cell 26 which can send potentials to the wells 2, 11 is constituted by the n-type diffusion layer 4 and the p-type diffusion layer 6. However, the dummy cell 26 for sending the potentials to the wells 2, 11 does not imply a cell functioning as a pair of the n-type diffusion layer 4 and the p-type diffusion layer 6. The dummy cell 26 for sending the potentials to the wells 2, 11 merely implies the cell in the shape continuation between the cells in the memory cell array 20.

A dummy pattern that is not accommodated in the n-well 2 is referred to as a non-bias dummy pattern 27 for convenience, and it is formed outside the memory cell array 20. Thus, a dummy cell bestriding between the well and the region where the well is not formed is also formed. Here, it is referred to as a well potential application/non-bias common dummy cell 28.

FIG. 5 is a sectional view showing the conditions of the diffusion layers respectively constituting the memory cell array 20 and the dummy cell region 22.

The n-well 2 is formed In a p-type semiconductor substrate 1. In the n-well 2, a p-type diffusion layer 3 and an n-type diffusion layer 4 are formed. The p-type diffusion layer 3 constitutes the CMOS transistor 8 in the memory cell array 20. The n-type diffusion layer 4 constitutes the dummy cell 26 in the dummy cell region 22.

Similarly, although a sectional view is omitted, an n-type diffusion layer 5 constituting the CMOS transistor 8 in the memory cell array 20 and a p-type diffusion layer 6 constituting the dummy cell 26 in the dummy cell region 22 are formed in the p-well 11 formed in the p-type semiconductor substrate 1.

Although it is not shown, an element formation region is partitioned by an element separation oxide film when a typical MOS transistor is formed. At this time, the region in which the dummy cell region is scheduled to be formed is partitioned into the same shape as the memory cell array, as well as the memory cell array.

In succession, when a gate electrode containing a side wall is formed, in the dummy cell region, the gate electrode is similarly formed to be the same shape as that of in the memory cell array, as well as the memory cell array. Such a formation enables a shape of an outermost cell 9 around an outermost circumference of the memory cell array 20 to be formed under the condition equal to that of an inner cell inside the outermost cell and also enables the shape deviation of the outermost cell 9 from the inner cell to be reduced to a minimum.

In this embodiment, a resist pattern is selectively formed at the thus-formed element formation region, in addition to the element separation oxide film and the gate electrode. The element separation oxide film, the gate electrode and the resist pattern are used as a mask, when an impurity is selectively injected by using a method such as an ion implantation and the like. If this method is used, as shown in FIGS. 4 and 5, although the diffusion layer of the memory cell array 20 formed in the n-well 2 is formed to be the p-type diffusion layer 3, the diffusion layer constituting the cell in the dummy cell region 22 can be formed to be the n-type diffusion layer 4 in the n-well 2. Similarly, although the diffusion layer of the memory cell array 20 formed in the p-well 11 mounted in the p-type semiconductor substrate 1 is formed to be the n-type diffusion layer 5, the diffusion layer constituting the cell in the dummy cell region 22 can be formed to be the p-type diffusion layer 6 in the p-well 11.

In short, a conductivity type of the diffusion layer constituting the dummy cell region 22 is set to be opposite to that of the diffusion layer of the cell adjacent to the dummy cell region 22 in the memory cell array 20. The conductivity type of the diffusion layer in the dummy cell region 22 is equal to a conductivity type of the well in which the cell in the memory cell array 20 is formed. Thus, the diffusion layer in the dummy cell region 22 also functions as an electrode for sending a potential to the well. For example, a positive power supply potential for driving the cell in the memory cell array 20 is sent to the n-type diffusion layer 4 in the dummy cell region 22, and the ground potential is sent to the p-type diffusion layer 6.

The conductivity types of the dummy cell and of the inner cell adjacent to the dummy cell in the memory cell array are opposite to each other. However, it is possible to neglect the influence caused by the fact that the conductivity types of the diffusion layers in the dummy cell and the inner cell adjacent to the dummy cell are opposite to each other. This is because there is no influence resulting from the fact that the first conductivity type of the impurity is diffused into the second conductivity type of diffusion layer, since the dummy cell and the inner cell are arranged at an interval required to protect the pattern break of the shape of the inner cell. Also, due to the same reason, there is no change in the operational property of the first conductive type of the inner cell resulting from the fact that the second conductivity type of the diffusion layer is adjacent to the inner cell. The required interval implies the minimum interval necessary for the manufacturing technique, for example, when the diffusion layers having the opposite conductivity types are formed.

Figure 7:
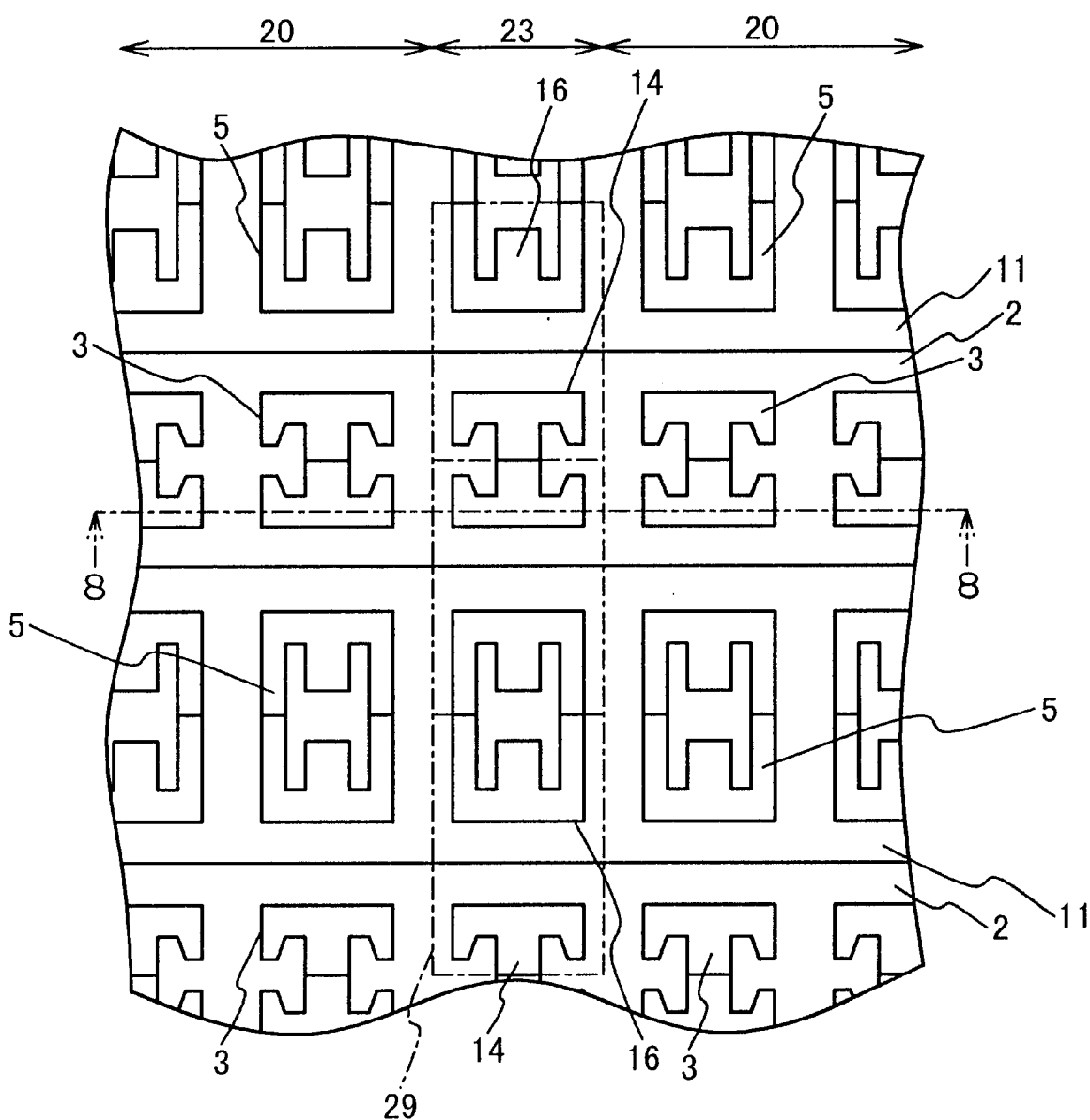
FIG. 7 is an enlarged plan view showing a second embodiment of a semiconductor apparatus in the present invention.

As a second embodiment in the present invention, an example in which the present invention is applied to a diffusion layer for sending a potential to a well which is provided inside a memory cell array will be described below with reference to FIGS. 7 and 8. FIG. 7 is an enlarged plan view enlarging an inner region 25 containing the diffusion layer for sending the potential to the well in the memory cell array 20 in FIG. 6A. And, FIG. 8 is a sectional view along a cut line Y–Y' in FIG. 7.

Figure 1:
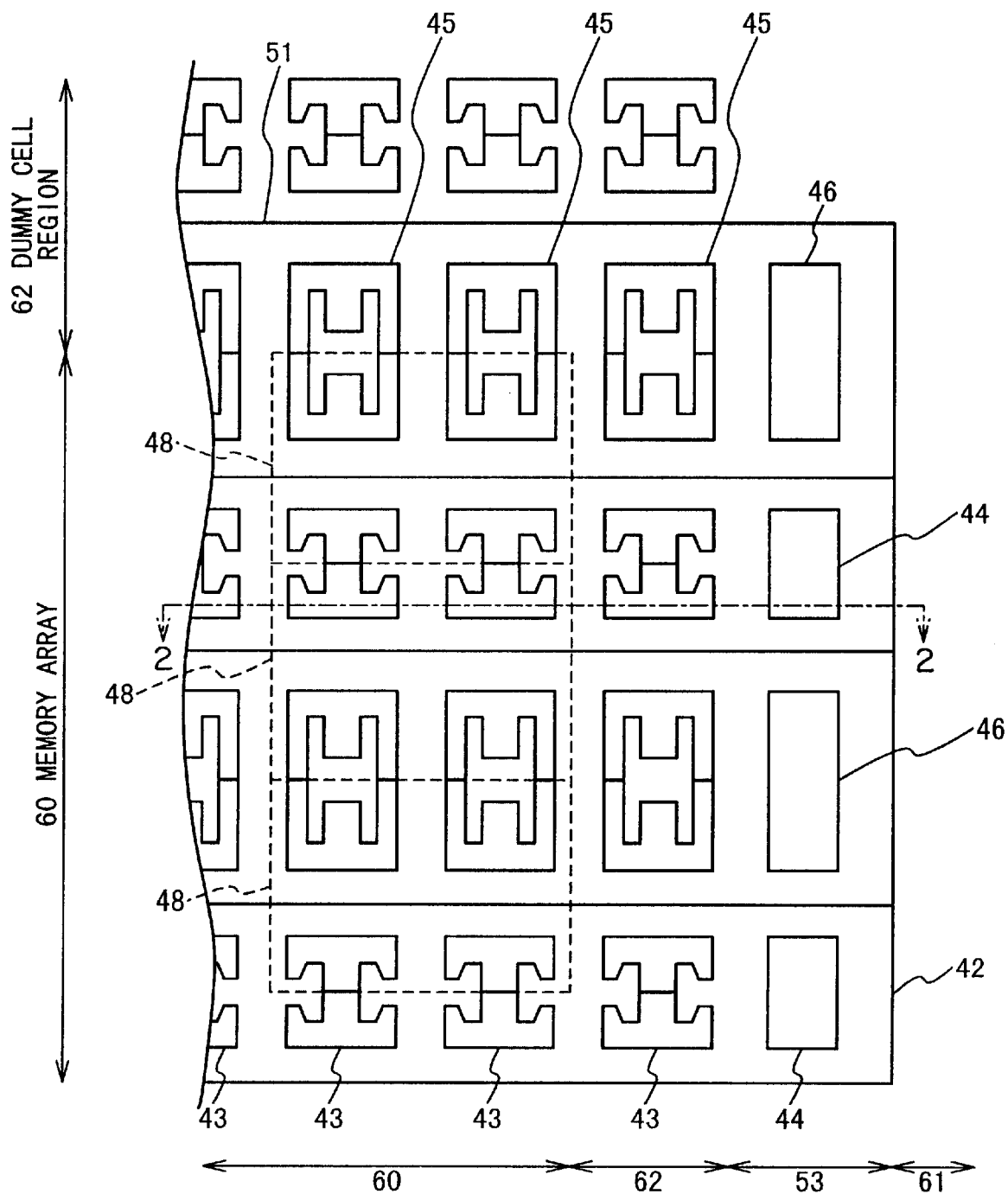
FIG. 1 is an enlarged plan view showing a condition near a dummy cell region of a conventional memory cell array.
Figure 2:
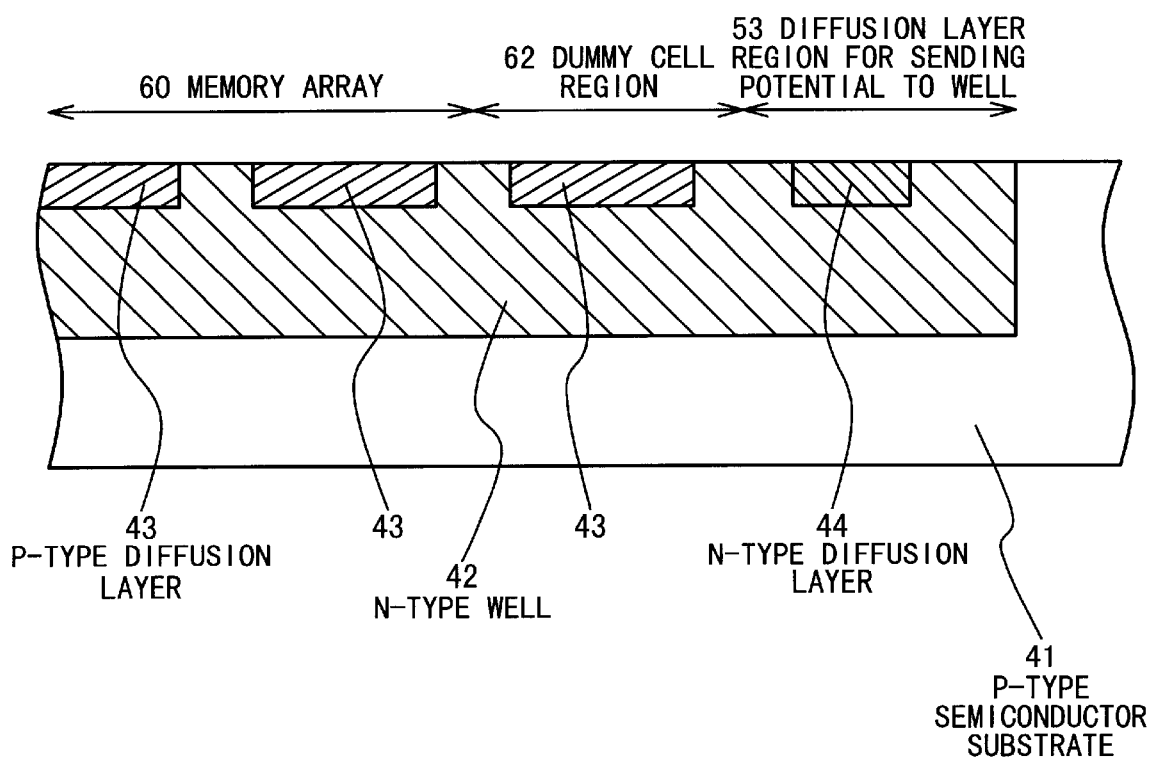
FIG. 2 is a sectional view in a cut line Z–Z' in FIG. 1.
Figure 3:
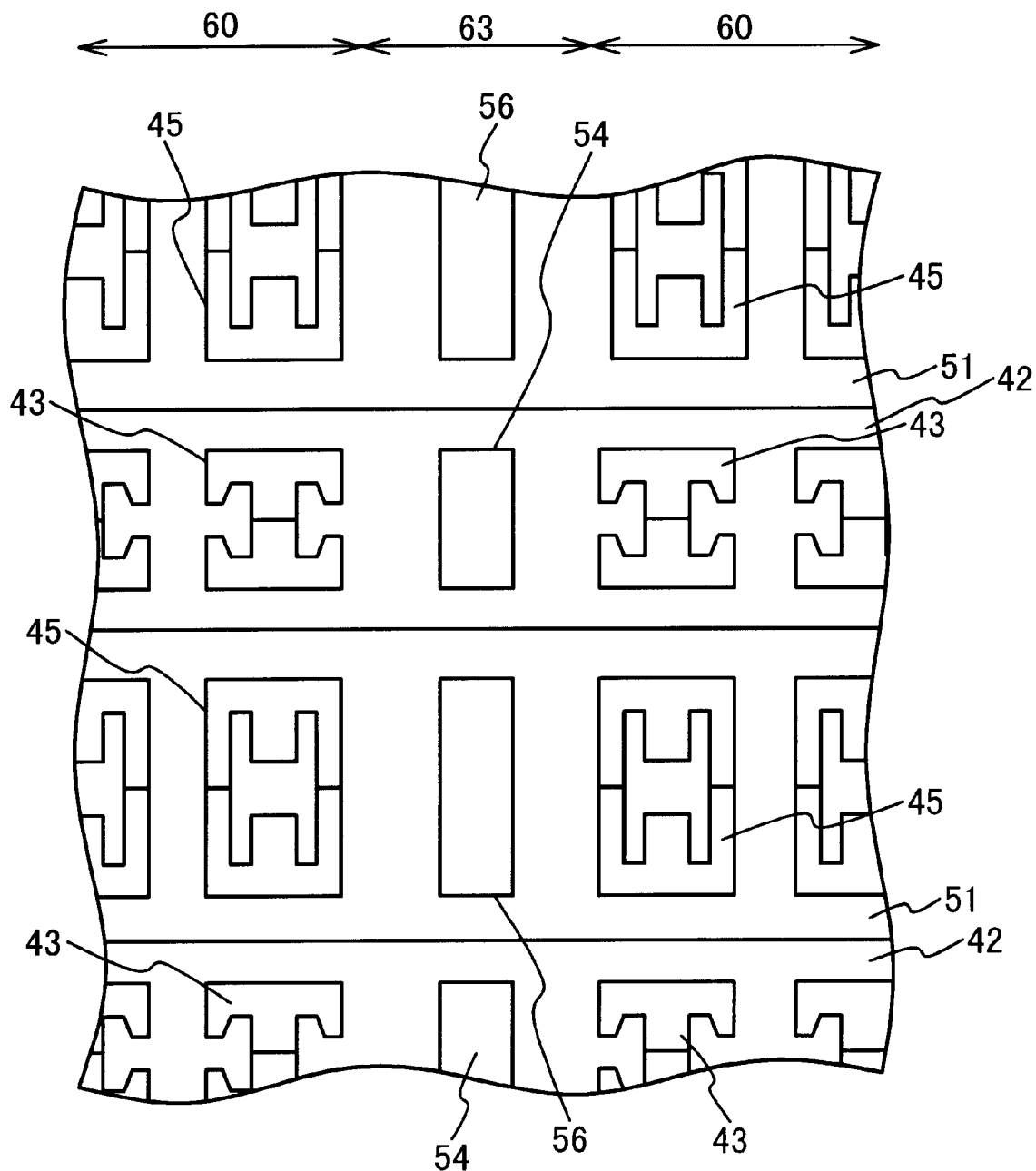
FIG. 3 is an enlarged plan view showing a condition near a diffusion layer for sending a potential to a well, in a conventional typical memory cell array.

Before the second embodiment in the present invention is described, the condition of a diffusion layer for sending a potential to a well, which is provided within a conventional memory cell array is shown in FIG. 3 by using a plan view. A plurality of diffusion layer regions 63 for sending potentials to wells are arranged for each several tens of cells. An n-type diffusion layer 54 and a p-type diffusion layer 56, which constitute the diffusion layer region 63 for sending the potentials to the wells, are formed in an n-well 42 and a p-well 51, respectively. The n-type diffusion layer 54 and the p-type diffusion layer 56 have the shapes respectively different from those of a p-type diffusion layer 43 and an n-type diffusion layer 45 constituting an inner cell. The reason why a distance between the diffusion layer region 63 and the inner cell is separated in FIG. 3 is to reserve an interval for the wiring to send the potentials to the diffusion layers.

Figure 8:
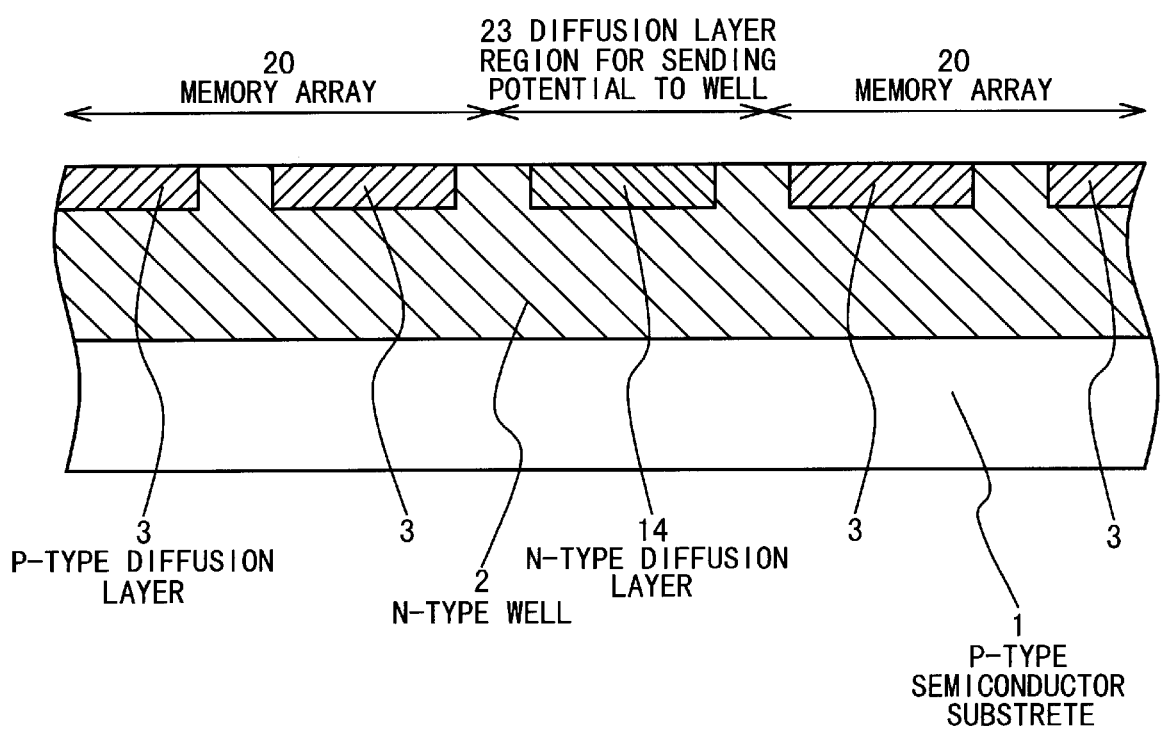
FIG. 8 is a sectional view in a cut line Y–Y' of FIG. 7.

In this embodiment, as shown in FIGS. 7 and 8, diffusion layer regions 23 for sending the potentials to the wells are arranged for each several tens of cells within a memory cell array 20, and they drive the memory cells. The diffusion layer region 23 for sending the potentials to the wells is provided with an n-type diffusion layer 14 and a p-type diffusion layer 16. The n-type diffusion layer 14 and the p-type diffusion layer 16 are formed in an n-well 2 and a p-well 11, respectively. The n-type diffusion layer 14 and the p-type diffusion layer 16 constitute an inner dummy cell 29.

The n-type diffusion layer 14 and the p-type diffusion layer 16 of the inner dummy cell 29, have the same shapes as the p-type diffusion layer 3 and the n-type diffusion layer 5 respectively constituting the inner cell. It is enough to use the method described in the first embodiment, in order that conductivity types of the diffusion layer region 23 are different from conductivity types of the diffusion layers in the inner cell adjacent to the diffusion layer region 23. In this case, the configuration of the dummy cell surrounding the memory cell array 20 is equal to that of the first embodiment.

In this embodiment, the cells having the same shape are formed in all of the inner side of the memory cell array, in addition to the effect obtained from the first embodiment. Thus, it is possible to form the cell array composed of the cells having the further uniform shape.

In the above-mentioned embodiments, the memory cell array has been described as the example. However, it is not limited to the memory cell array. It is natural that the similar effect of the area reduction can be obtained even if the configuration of the present invention is applied to a semiconductor apparatus using the regular repetition patterns in the CMOS configuration.

The first effect is to remove the diffusion layer for sending the potential to the well, which is required in the end of the above-mentioned conventional memory cell array. This reason is as follows. As mentioned above, the dummy cell mounted to protect the shape break of the memory cell can be used as the diffusion layer for sending the potential to the well, since the conductivity type of the diffusion layer constituting the dummy cell is made opposite to that of the diffusion layer of the memory cell adjacent to the dummy cell.

As the second effect, the diffusion layer for sending the potential to the well, which conventionally has the shape different from that of the memory cell mounted inside the memory cell array, can be configured in the pattern of the memory cell, in the present invention. Thus, all of the memory cell array can be formed under the same cell pattern. Hence, there is no difference between the roughness and the density in the pattern within the memory cell array. Therefore, it is possible to form the cell array composed of the cells having the further uniform shape over the inner side of the memory cell array.

What is claimed is:

1. A semiconductor apparatus, comprising:
   a cell having a first conductivity type of diffusion layer formed in a second conductivity type of semiconductor region, wherein said second conductivity type is opposite to said first conductivity type; and
   a dummy cell having said second conductivity type of dummy diffusion layer formed in said semiconductor region, wherein said dummy cell is formed adjacent to said cell and in an end portion of said semiconductor region.

2. The semiconductor apparatus according to claim 1, wherein a predetermined voltage is supplied to said semiconductor region through said dummy diffusion layer.

3. The semiconductor apparatus according to claim 2, wherein said predetermined voltage is used to drive said cell.

4. The semiconductor apparatus according to claim 2, wherein said predetermined voltage is a positive voltage when said dummy diffusion layer is n-type and said predetermined voltage is a grounded voltage when said dummy diffusion layer is p-type.

5. The semiconductor apparatus according to claim 1, wherein said dummy cell is formed to be a same shape as said cell.

6. The semiconductor apparatus according to claim 1, wherein said dummy diffusion layer is formed to be a same shape as said diffusion layer.

7. The semiconductor apparatus according to claim 1, further comprising:
a cell array in which a plurality of said cells are arranged at substantially equal intervals with each other, and
wherein said dummy cell and said plurality of cells are arranged at said substantially equal intervals with each other.

8. The semiconductor apparatus according to claim 7, further comprising:
a specific dummy cell having a specific dummy diffusion layer which is formed inside said cell array, and
wherein a preset voltage is supplied to said semiconductor region through said specific dummy diffusion layer and said specific dummy diffusion layer is formed to be a same shape as said diffusion layer.

9. The semiconductor apparatus according to claim 8, wherein said specific dummy cell and said plurality of cells are arranged at said substantially equal intervals with each other.

10. The semiconductor apparatus according to claim 8, wherein a predetermined voltage is supplied to said semiconductor region through said dummy diffusion layer and said predetermined voltage is substantially identical to said preset voltage.

11. The semiconductor apparatus according to claim 1, further comprising:
a peripheral circuit unit provided to be adjacent to said dummy cell.

12. A semiconductor memory apparatus, comprising:
a memory cell having a first conductivity type of memory diffusion layer formed in a second conductivity type of semiconductor region, wherein said second conductivity type is opposite to said first conductivity type; and
a dummy cell having said second conductivity type of dummy diffusion layer formed in said semiconductor region, wherein said dummy cell is formed adjacent to said memory cell and in an end portion of said semiconductor region.

13. A semiconductor apparatus, comprising:
a first transistor having a first conductivity type of first diffusion layer formed in a second conductivity type of second semiconductor region, wherein said second conductivity type is opposite to said first conductivity type;
a second transistor having said second conductivity type of second diffusion layer formed in said first conductivity type of first semiconductor region, wherein said first and second diffusion layers are arranged at substantially equal intervals with each other to form a cell array;
a first dummy cell having said second conductivity type of first dummy diffusion layer formed in said second semiconductor region, wherein said first dummy diffusion layer is adjacent to said first diffusion layer; and
a second dummy cell having said first conductivity type of second dummy diffusion layer formed in said first semiconductor region, wherein said second dummy diffusion layer is adjacent to said second diffusion layer, and
wherein said firs and second dummy cells are arranged outside said cell array and formed in end portions of said first and second semiconductor regions, conductivity and said first and second diffusion layers and said first and second dummy diffusion layers are arranged at said substantially equal intervals with each other.

14. The semiconductor apparatus according to claim 13, wherein a first predetermined voltage is supplied to said first semiconductor region through said second dummy diffusion layer and a second predetermined voltage is supplied to said second semiconductor region through said first dummy diffusion layer.

15. The semiconductor apparatus according to claim 14, wherein said first predetermined voltage is used to drive said second transistor and said second predetermined voltage is used to drive said first transistor.

16. The semiconductor apparatus according to claim 13, wherein said first dummy diffusion layer is formed to be a same shape as said first diffusion layer and second dummy diffusion layer is formed to be a same shape as said second diffusion layer.

17. The semiconductor apparatus according to claim 13, further comprising:
a first specific dummy diffusion layer formed inside said cell array, wherein said first predetermined voltage is supplied to said first semiconductor region through said first specific dummy diffusion layer and said first specific dummy diffusion layer is formed to be a same shape as said second diffusion layer; and
a second specific dummy diffusion layer formed inside said cell array, wherein said second predetermined voltage is supplied to said second semiconductor region through said second specific dummy diffusion layer and said second specific dummy diffusion layer is formed to be a same shape as said first diffusion layer.

18. The semiconductor apparatus according to claim 17, wherein said first and second specific dummy diffusion layers and said first and second diffusion layers and said first and second dummy diffusion layers are arranged at said substantially equal intervals with each other.

19. The semiconductor apparatus according to claim 13, further comprising:
a peripheral circuit unit provided to be adjacent to said first and second dummy cells.

20. The semiconductor apparatus according to claim 13, wherein said first and second transistors are a complementary pair.

21. The semiconductor apparatus according to claim 13, wherein said semiconductor apparatus is a SRAM (static random access memory).

* * * * *